(12) United States Patent
Deshmukh

(10) Patent No.: US 6,441,473 B1
(45) Date of Patent: Aug. 27, 2002

(54) FLIP CHIP SEMICONDUCTOR DEVICE

(75) Inventor: Rajan D. Deshmukh, Pennington, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/609,582

(22) Filed: Jun. 30, 2000

Related U.S. Application Data

(63) Continuation-in-part of application No. 08/928,939, filed on Sep. 12, 1997, now abandoned.

(51) Int. Cl.[7] .................. H01L 23/495; B23K 31/02
(52) U.S. Cl. .................. 257/669; 257/692; 257/738; 257/773; 257/780; 257/782; 228/180.22
(58) Field of Search .................. 257/692, 723, 257/724, 737, 738, 669, 642, 643, 780, 781, 784, 782, 778; 228/180.22

(56) References Cited

U.S. PATENT DOCUMENTS

| | | | |
|---|---|---|---|
| 5,148,266 A | | 9/1992 | Khandros et al. ............ 257/773 |
| 5,346,861 A | * | 9/1994 | Khandros et al. ............. 438/15 |
| 5,679,977 A | * | 10/1997 | Khandros et al. ........... 257/692 |
| 5,682,061 A | * | 10/1997 | Khandros et al. ........... 257/666 |
| 5,801,446 A | * | 9/1998 | Distefano et al. ........... 257/778 |
| 5,848,467 A | * | 12/1998 | Khandros et al. ............. 29/841 |
| 5,994,781 A | * | 11/1999 | Smith ......................... 257/773 |
| 6,028,354 A | * | 2/2000 | Hoffman ..................... 257/706 |
| 6,150,194 A | * | 11/2000 | Sakaguchi et al. .......... 438/118 |
| 6,211,572 B1 | * | 4/2001 | Fjelstad et al. ............. 257/781 |
| 6,239,489 B1 | * | 5/2001 | Jiang .......................... 257/738 |
| 6,323,542 B1 | * | 11/2001 | Hashimoto .................. 257/669 |

FOREIGN PATENT DOCUMENTS

| | | | |
|---|---|---|---|
| EP | WO 96/09746 | * | 3/1996 |
| JP | 1-155633 | * | 6/1989 |

* cited by examiner

*Primary Examiner*—David L. Talbott
*Assistant Examiner*—Alonzo Chambliss
(74) *Attorney, Agent, or Firm*—Lowenstein Sandler PC

(57) ABSTRACT

An improved flip chip assembly is disclosed of the type where a semiconductor chip having a certain thermal expansion coefficient is directly mounted via solder bumps on the metallization pattern of a circuit substrate having a different thermal expansion coefficient. A base layer comprised of a polymer material is disposed over the surface of the chip, between the chip and the substrate, and the solder bumps are placed over the base layer; the base layer modifies the effective thermal expansion coefficient of the solder bumps to approximate that of the substrate, thus reducing the thermal expansion coefficient differential at the junction of the chip and the substrate.

7 Claims, 4 Drawing Sheets

FLIP CHIP SEMICONDUCTOR DEVICE

RELATED APPLICATION

This application is a continuation-in-part application of U.S. Pat. application Ser. No. 08/928,939, filed Sep. 12, 1997 now abandoned, incorporated herein by reference, and claims the benefit of the filing date thereof.

FIELD OF THE INVENTION

The present invention relates to a flip chip semiconductor assembly for mounting a chip to a substrate via solder bumps. More particularly, it relates to a flip chip assembly in which a base layer is disposed between the chip and solder bumps to reduce the thermal expansion coefficient differential at the juncture of the chip and the substrate.

BACKGROUND OF THE INVENTION

A flip chip assembly involves mounting at least one bare silicon chip to a circuit board or laminate substrate. FIG. 1, for example, shows a typical prior art flip chip assembly device 8. Referring to FIG. 1, each silicon chip 10 has at least one (and likely a plurality on bond pad electrodes 12 formed on its active surface. A plurality of solder bumps 14 are formed on the pads, the solder bumps typically projecting from the pad at a height of approximately 100 $\mu$m. The chip 10 is mounted on the circuit substrate 16 by connecting the solder bumps 14 to the metallization pattern fabricated on the substrate, e.g., via substrate electrodes 18. The flip-chip technique is used in high performance devices and portable electronics to achieve devices that are low in weight, have high functionality, and are low in cost.

A drawback with the flip chip assembly, however, relates to differences in the thermal expansion coefficients of the chip 10 and the substrate 16. The temperature of a semiconductor chip typically will rise during operation. Heat generated from the chip will be transmitted to the substrate through the solder bumps, thus raising the temperature of the substrate. The chip and substrate will then thermally expand. Often with flip-chip semiconductor devices, there will be a difference between the thermal expansion coefficient of the chip and the substrate. The chip is generally comprised of silicon (with a thermal expansion coefficient of approximately 2.5–3.0 ppm/° C.) and the substrate is often comprised of a fiber reinforced material, laminated glass plates impregnated with epoxy (with a thermal expansion coefficient of approximately 16–18 ppm/° C.) or a ceramic substrate (with a thermal expansion coefficient of approximately 6 ppm/° C.). Thermal stresses caused by this differential will concentrate in the solder bumps, causing premature failure of the solder bumps and degrading the long-term reliability of the semiconductor device.

To enhance the life of a flip-chip device, underfill epoxy materials have been used and placed between the chips and the substrate. However, the use of underfill materials requires extra processing, making the assembly process cumbersome and time-consuming. Underfill epoxy materials are also expensive.

As may be appreciated, those in the field of communications systems and in particular semiconductor devices continue to seek to develop new configurations that improve efficiency of manufacture and device performance. These and further advantages of this invention may appear more fully upon consideration of the detailed description below.

SUMMARY OF THE INVENTION

Summarily described, the invention embraces a semiconductor device comprising a semiconductor chip with its active side mounted on a substrate. The substrate has a predetermined thermal expansion coefficient different from that of the chip. To address the thermal expansion coefficient differential between the substrate and the chip, a monolithically-deposited base layer with two major surfaces is placed on the chip, the first major surface of the base layer being disposed on the active side of the chip and the second major surface of the base layer being disposed adjacent the substrate. At least one bond pad is disposed on the chip and coupled to the second major surface of the base layer. Solder bumps are disposed over the base layer and coupled to the bond pads. The solder bumps experience an effective thermal expansion coefficient which depends on the base layer thickness, and the base layer reduces the thermal expansion coefficient differential at the junction of the chip and the substrate. The base layer is preferably comprised of a polymeric material and may be deposited on a wafer level.

The invention further pertains to a method of preparing a plurality of semiconductor chips for mounting to circuit substrates. The method comprises providing a plurality chips on a wafer, each of which chip has at least one bond pad thereon. A polymer layer is monolithically deposited over the plurality of chips and bond pads, and then the polymer layer is removed in the regions of the bond pads to expose the bond pads. An interconnect metallic layer is placed over the plurality of chips to connect the bond pads to the surface of the polymer layer, and solder bumps are placed on the interconnect metallic layer.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Figure 1:
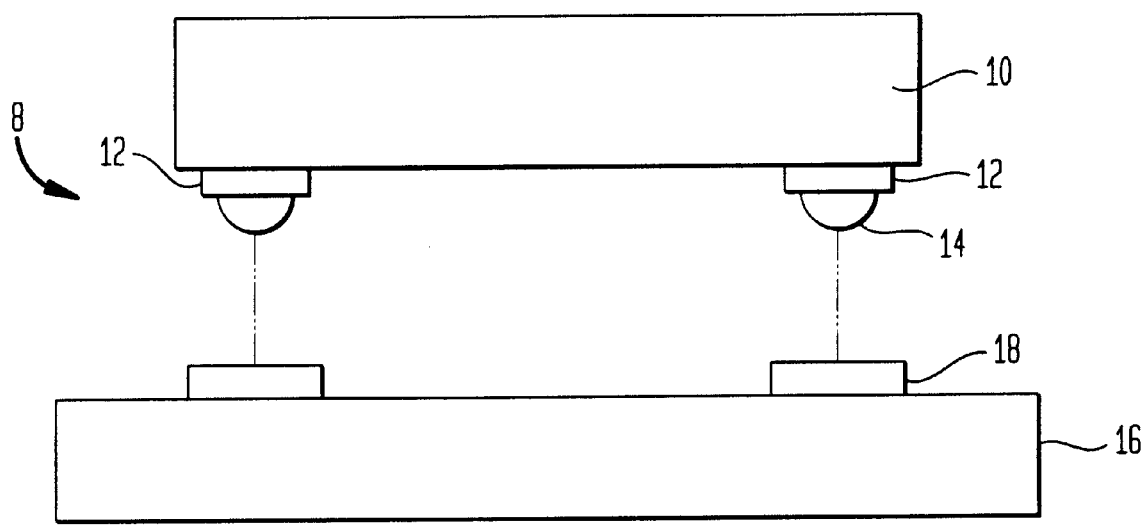
FIG. 1 shows a cross-sectional view of a prior art semiconductor flip chip device.

FIG. 1 shows a cross-sectional view of a prior art flip chip assembly device which has been previously described. The invention reduces the thermal expansion coefficient between the chip 10 and substrate 16 of FIG. 1 without use of underfill epoxy materials and with use of a monolithically deposited polymer layer. Notably, the invention is described with reference to an individual chip and the invention could be practiced in that fashion. However, one of the advantages of this invention is that the flip chip assembly can be prepared on a wafer level i.e., where a plurality of chips can be substantially simultaneously prepared for mounting on a wafer. With this invention, the thermal expansion coefficient experienced by the solder bumps is modified to approximate that of the substrate, thus reducing the thermal expansion coefficient differential at the juncture of the chip and the substrate and improving the fatigue life of the device.

Figure 2A:
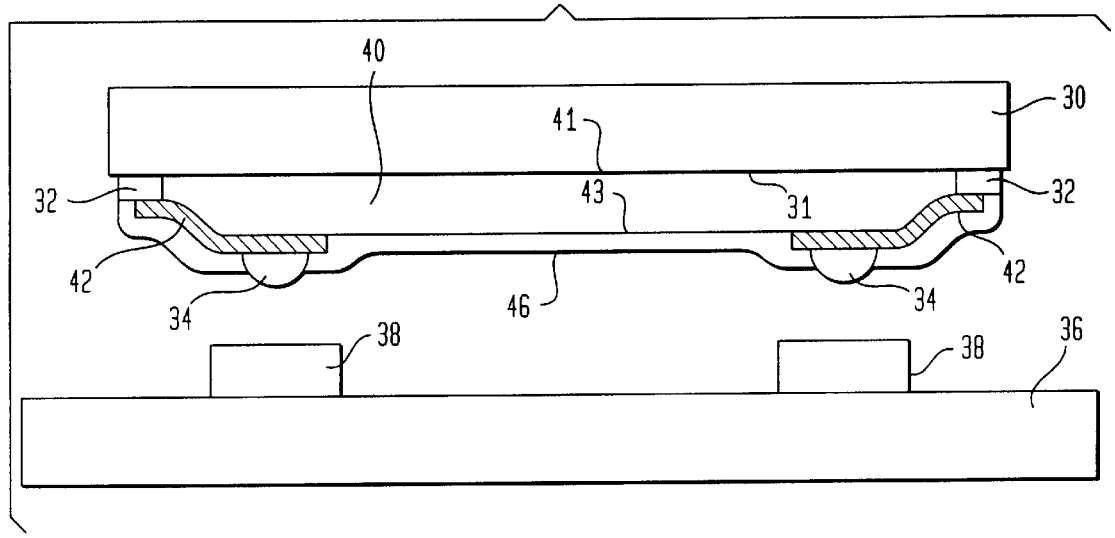
FIG. 2A shows a cross-sectional view of one embodiment of the inventive flip chip device.

More particularly with reference to the figures, FIG. 2A shows a cross-sectional view of one embodiment of the invention. The semiconductor device comprises a chip 30 with an active side 31 on which is disposed at least one (and likely a plurality of) bond pad electrodes 32 (two are shown). The chip 30 has an assembly adapted for mounting to the substrate 36. The bond pad electrodes may comprise aluminum metallized pads, although any material known in the art for fabricating bond pad electrodes may be used. At least two (and likely a greater plurality of) solder bumps 34 are provided for connecting the chip 30 to the substrate 36 (two solder bumps are shown). The solder bumps 34 are adapted for connection to the metallization pattern or electrodes 38 of the substrate. The solder bumps 34 may be fabricated with gold, a mixture of gold-tin, lead-tin, indium-tin, or other compositions known in the art for soldering a chip to a substrate.

A base or polymer layer 40 is disposed over the active side 31 of the chip, in the center of the chirp between the bond pads 32. The base layer may be comprised of a single polymer layer or multiple laminates or layers. In any case, the base layer 40 has a first major surface 41 and a second major surface 43, with the first surface 41 being placed over the active side of the chip 31, and the second surface supporting the solder bumps 34. The base layer 40 is a monolithically-deposited layer. That is, during fabrication it is deposited over the chip surface and bond pads thereon as a "blanket" layer, and then portions of the base layer are removed to expose the bond pads. As such, the base layer abuts the bonds pads as shown (e.g., the word "abut" meaning to touch along a border). The use of the monolithically-deposited layer eases the fabrication steps, enables fabrication of the chip assembly on a wafer level, and provides for a stable interconnect layer. An interconnect metallic layer 42 overlies the base layer and couples the bond pads 32 to the second surface 43 of the base layer 40 and the solder bumps 34, with the solder bumps being disposed on the metallic layer 42. Since the base layer abuts the bond pads and the metallic layer is deposited thereover, the underside of the metallic layer is continuously supported and is therefore a stable layer. Thus, there is no requirement for use of a further encapsulant to protect the metallic interconnect layer, as in U.S. Pat. No. 5,148,266 to Khandros et al. Optionally, however, a top layer 46, preferably comprised of polymer material may be used for confining the solder bumps to the pad region and preventing solder spreading. The top polymer layer is particularly advantageous when the solder bumps comprise eutectic solder.

The base layer 40 addresses the thermal expansion coefficient differential at the juncture of the chip and substrate. The substrate 36 has a first thermal expansion coefficient, and the chip 30 has a second thermal expansion coefficient different from the first to define a thermal expansion coefficient differential. This differential is reduced by the base layer. It has been discovered that with the use of the base layer, the solder bumps will experience a modified effective thermal expansion coefficient, depending on the base layer thickness and properties. This modified thermal expansion coefficient serves to reduce the thermal expansion coefficient differential, thereby improving the fatigue life of the device.

The base layer may be comprised of polymers such as dielectric laminate materials, including benzocyclobutene, commonly known as BCB, polyimide, and polytetrafluoroethene. Photosensitive polyimides, such as polyimide-isoindolo-quinazolinedione, one version of which is sold by Hitachi Corporation under the tradename PIQ-13, and polyphenyl quinoxaline, which is commonly sold in the industry under the tradename PPQ, advantageously may be used. However, any photo-definable dielectric polymer satisfying the adhesive and thermal expansion coefficient properties revealed herein may be used, i.e., a polymer that will adhere to the chip and interconnect metallic layer while modifying the thermal expansion coefficient experienced by the solder bumps to approximate that of the substrate.

Depending on the materials used, the thickness of the base layer may be adjusted. For example, when a base layer of 0.03 millimeters in thickness is used, the effective thermal expansion coefficient of the solder bumps as modified by the base layer is 5–7 ppm/° C. When a base layer of 0.2 millimeters in thickness is used, the effective thermal expansion coefficient of the solder bumps is 14–15 ppm/° C. Preferably, the effective thermal expansion coefficient of the solder bumps (as modified by the base layer) should match the thermal expansion coefficient of the substrate, which is generally about 16–18 ppm. It has been found that a base layer of from 0.1 to 0.3 millimeters in thickness is advantageous for this purpose.

The interconnect metallic layer 42 should be fabricated with a conductive material. Copper, nickel, gold, or compositions of these materials advantageously may be used. The metallic layer 42 comprises a thin layer of conductive material, preferably sputtered on the device, for coupling the bond pads 32 to the top surface 43 of the base layer, so it is sufficient if the metallic layer is of a thickness of 1–4$\mu$m. The metallic layer 42 adheres well to the underlying base layer. The composition of the top layer 46 is not as critical as the composition of the base layer 40; the top layer 46 serves effectively as a mask for retaining the solder bumps 34 within a geometrically confined region. Thus, a different composition may be used for the top layer 46, depending upon cost and supply constraints. The top layer 46 is also, however, advantageously comprised of a polymer material.

Figure 2B:
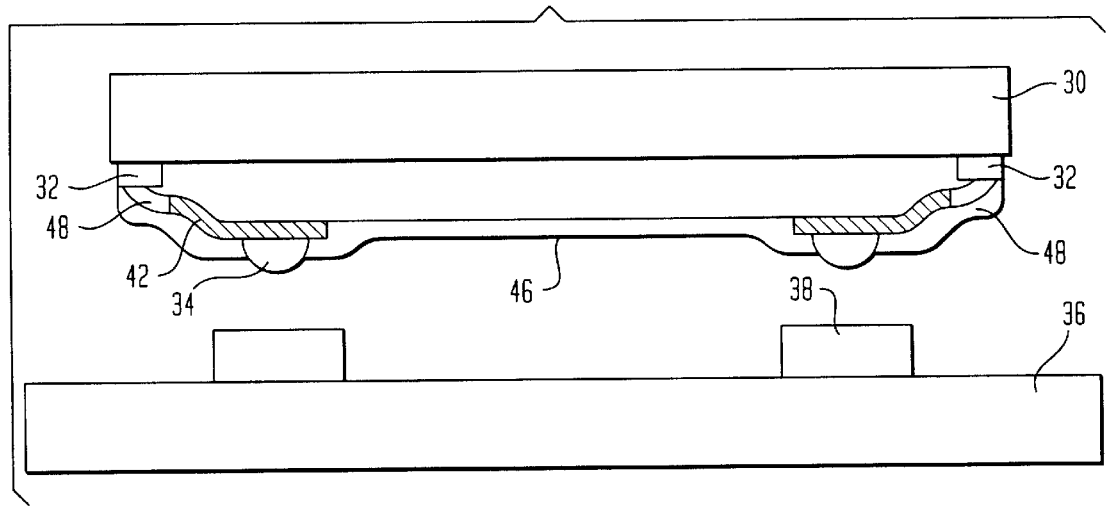
FIG. 2B shows a cross-sectional view of another embodiment of the inventive flip chip device.

Referring to FIG. 2B, there is shown a cross-sectional view of an alternative embodiment of the semiconductor device. The same character references are used to refer to like features as in FIG. 2A. However, with this embodiment, the metallic layer 42 is sputtered over a portion of the base layer 40, without necessarily connecting the solder bump 34 to the bond pad 32. A conductive wire 48 is connected at one end to the bond pad 32 and at the other end to the metallic layer 42, for coupling the bond pad 32 to the top of the base layer 40 and solder bumps 34. The wire bond 48 is advantageous in ensuring the integrity of the connections between the bond pad 32, the surface 43 of the base layer, and the solder bumps 34 during operation of the device. Although use of the conductive wire 48 requires additional processing steps as compared with the embodiment of FIG. 2A, the FIG. 2B embodiment may be prepared on a wafer level given the use of monolithically-deposited base layer.

Figure 3A:
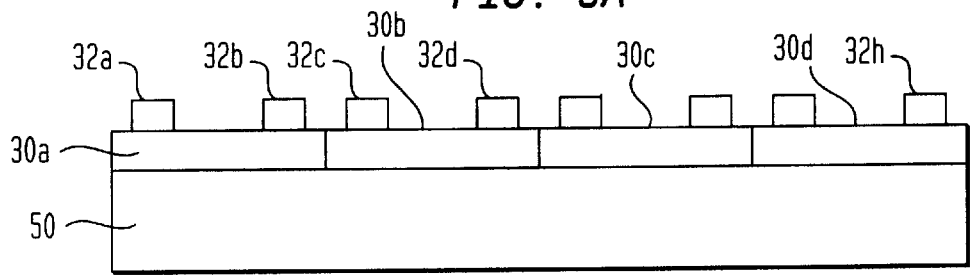
FIGS. 3A–3G show cross-sectional views of a plurality of chips at stages of fabrication to prepare a plurality of flip-chip devices having the configuration shown in FIG. 2A.
Figure 3B:
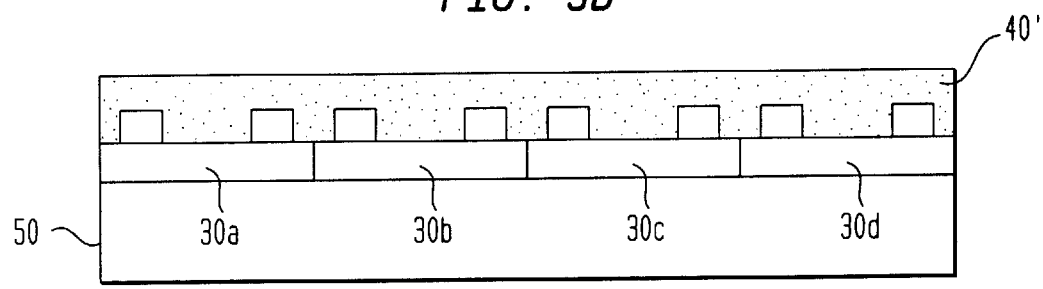

Referring to FIGS. 3A through 3G, there are shown cross-sectional views of a plurality of chips during various stages of fabrication to produce the individual assembly of FIG. 2A. The method is described on a wafer level with a plurality of chips being mounted on the substrate, and it is contemplated that the fabrication will be carried out in this fashion to maximize production efficiencies. However, the fabrication could be carried out at a chip level also. Referring to FIG. 3A, a plurality of semiconductor chips 30a, 30b, 30c, 30d, are provided on wafer 50. Each of the chips has one or more bond pads 32a, 32b, 32c, etc., on its active side. The bond pads may be disposed adjacent the periphery of each chip, or they may be found at other locations on the chip, which is another advantage of this invention (e.g., the location of the bond pads on the chip is not critical to enabling the fabrication). Then, a first step as shown in FIG. 3B is to monolithically apply a base layer 40' to the chip, which is preferably comprised of polymeric material. The polymer is advantageously applied in a liquid or laminate form and then baked to a semi-hardened state. One or more layers of polymer may be applied to form the base layer. The thickness of the base layer is important in the operation of the invention, i.e., for modifying the effective thermal expansion coefficient of the solder bumps, as previously described. Thus, to achieve the desired thickness, the polymer can be sprayed, spun, or laminated over the chip, preferably in a deliberate manner.

Figure 3C:
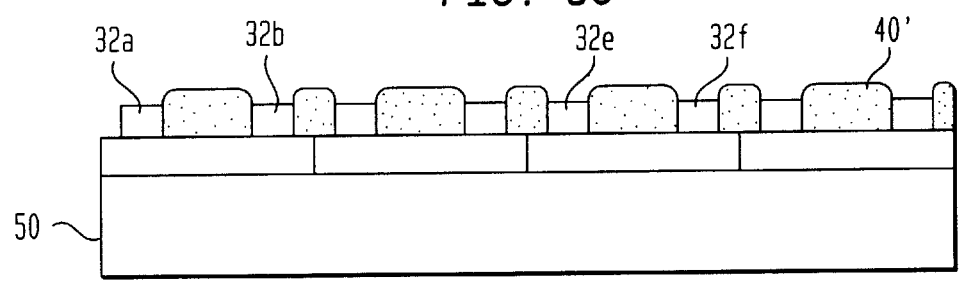
Figure 3D:
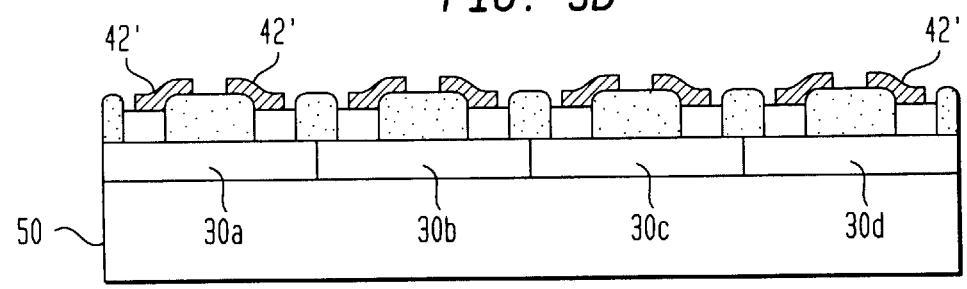

Once a base layer having the desired thickness is applied over the chip, the polymer (or other material forming the base layer) should be etched away in the region of the bond pads to expose all or part of the pads as shown in FIG. 3C. This removal of the base layer at the bond pads can be achieved by using photodefinable polymers. Once the bond pads are exposed, metals are deposited by sputtering or evaporation over the chip to form an interconnect metallic layer 42'. Methods for interconnect layer wafer deposition are well known and can be applied for this step of the method. FIG. 3D illustrates the plurality of chips with the metallic layer applied. Advantageously, a removable polymer mask first can be applied before the conductive metals are sputtered on the chip, so that the removable polymer mask will define the region for deposition of the metallic layer. Polymers that advantageously may be used for this disposable mask layer comprise photodefinable mask polymers, which are well known.

Figure 3E:
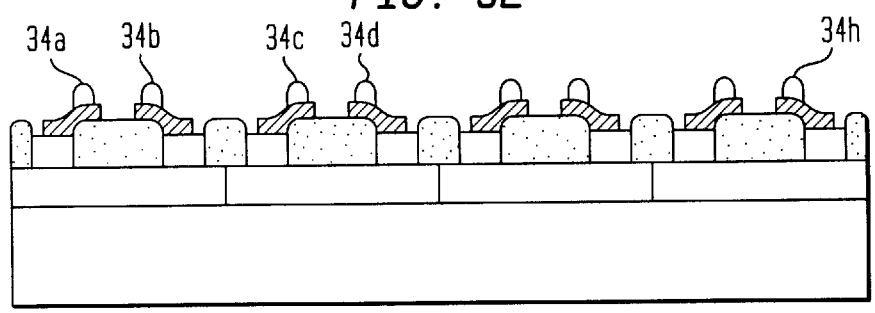
Figure 3F:
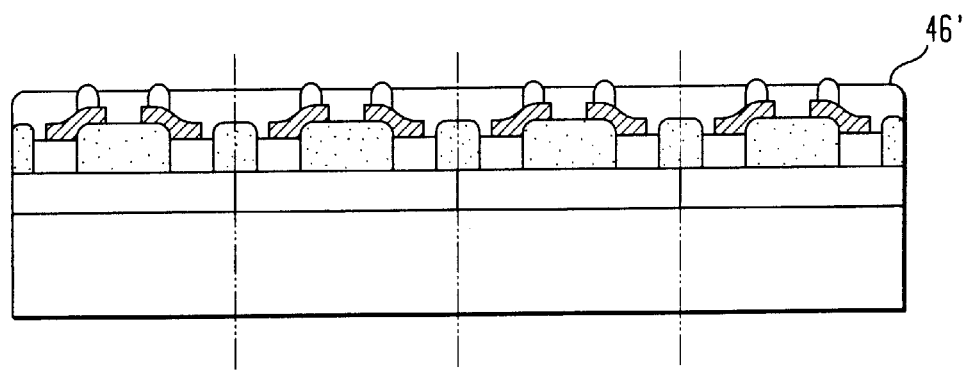
Figure 3G:
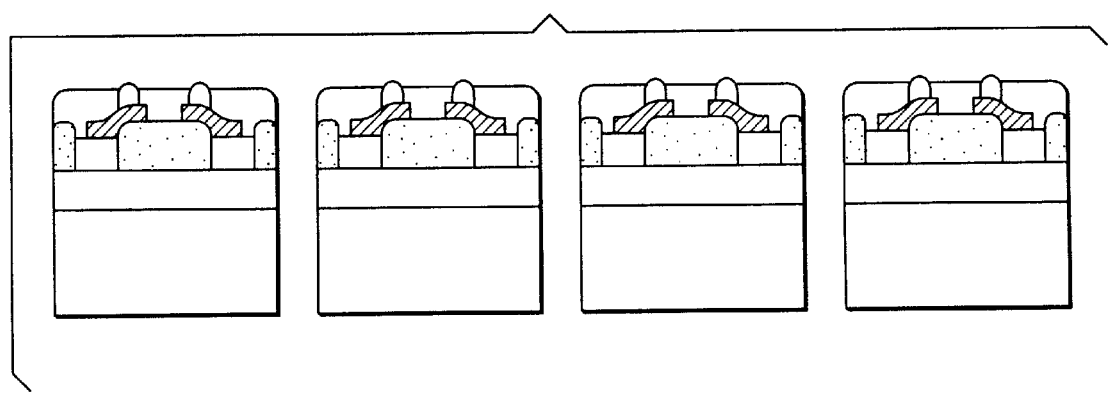

As next shown in FIG. 3E, solder bumps 34a, 34b, 34c, ... 34h are then deposited over the metallic layer. Again, a polymer mask (or top layer) first can be applied over the chip before the solder bumps are deposited to define the geometrical region for the bumps and confine solder spreading, as illustrated in FIG. 3F. This polymer mask need not be removed, forming the top layer 46 of the device (FIG. 3F). At this or an earlier point in the fabrication process, the wafer is diced so that individual chips (FIG. 3G) are provided for mounting to the circuit substrate, and known methods for soldering a flip chip to a circuit substrate may be used for this purpose. It will be appreciated that the wafer can be diced into chips at any point during the fabrication process, but advantageously the dicing is performed either before or after the step of depositing the solder bumps to maximize the wafer-level deposition.

Additionally, a conductive wire can be connected at one end to the bond pads and at the other end to the interconnect metallic layer, for coupling the bond pad to the top surface 43 of the base layer and solder bumps, to provide the embodiment of FIG. 2B. As previously described, the wire bond may be advantageous in promoting the integrity of the connections between the bond pad, base layer surface, and solder bumps during later operation of the device. In the event the reliability of the connection between the bond pads and base layer may be adversely affected during operation of the device, the wire bond provides an additional measure of reliability with the connections.

It will be understood that the embodiments described herein are merely exemplary and that a person skilled in the art may make variations and modifications without departing from the spirit and scope of the invention. All such variations and modifications are intended to be included within the scope of the appended claims.

I claim:

1. A semiconductor chip assembly mounted to a substrate, the substrate having a first thermal expansion coefficient and a surface having at least one electrode thereon, the chip assembly comprising:

a semiconductor chip having a second thermal expansion coefficient;

at least one bond pad disposed on the active side of the chip;

a monolithically-deposited base layer abutting the bond pad having a first surface adjacent the active side of the chip and a second surface adjacent the substrate;

at least one solder bump disposed on the chip for coupling the chip to the substrate, the solder bump having an effective thermal expansion coefficient dependent upon the material and thickness of the base layer;

metallic interconnect layer deposited on the second surface of the base layer for coupling the solder bump to the bond pad, the interconnect layer having an underside facing the active side of the chip, and the underside is substantially continuously supported by the second surface of the base layer;

wherein the base layer is comprised of at least one layer of polymeric material and has a composition and thickness selected wherein, when the solder bump is coupled to the at least one electrode, the base layer will modify the effective thermal expansion coefficient of the at least one solder bump so that the difference between the effective thermal expansion coefficient and the first thermal expansion coefficient is less than the difference between the first and second thermal expansion coefficients.

2. The chip assembly according to claim 1, in which the interconnect metallic layer is a sputterdeposited layer fabricated from one or more metals selected from the group consisting of copper, nickel and gold.

3. The chip assembly according to claim 1, further comprising a conductive wire having a first and a second end, wherein the first end is coupled to the interconnect metallic layer and the second end is coupled to the at least one bond pad.

4. The chip assembly according to claim 1, in which the base layer is fabricated with a polymer selected from benzocyclobutene, polyimide, and polytetrafluoroethene.

5. The chip assembly of claim 1 wherein the base layer comprises at least one layer of a photo-definable dielectric polymer having sufficient adhesive and thermal expansion coefficient properties and being sufficiently thin that the base layer will adhere to the chip and modify the effective thermal expansion coefficient to be approximately the same as the first thermal expansion coefficient.

6. A semiconductor flip chip assembly mounted to a substrate, the substrate having a first thermal expansion coefficient and a surface having at least one electrode thereon, the chip assembly comprising;

a semiconductor chip having an active side and a second thermal expansion coefficient;

at least one bond pad disposed on the active side of the chip;

a monolithically-deposited base layer abutting the at least one bond pad, the base layer having a first surface adjacent the active side of the chip and a second surface adapted to be adjacent the substrate;

a sputter-deposited metallic interconnect layer on the second surface of the base layer and the at least one bond pad, the metallic interconnect layer having an underside facing the active side of the chip, the underside being substantially continuously supported on its underside by the base layer and the at least one bond pad; and at least one solder bump disposed on the metallic interconnect layer for coupling the at least one solder bump to the at least one bond pad, the solder bump having an effective thermal expansion coefficient dependent upon the material and thickness of the base layer;

wherein the base layer is comprised of at least one layer of polymeric material and has a composition and thickness selected wherein, when the solder bump is coupled to the at least one electrode, the base layer will modify the effective thermal expansion coefficient of the at least one solder bump so that the difference between the effective thermal expansion coefficient and the first thermal expansion coefficient is less than the difference between the first and second thermal expansion coefficients.

7. The device of claim 6 in which the metallic interconnect layer being supported on its underside does not require an encapsulant for protection.

* * * * *